US011008456B2

(12) United States Patent
Liao et al.

(10) Patent No.: US 11,008,456 B2
(45) Date of Patent: May 18, 2021

(54) RESIN COMPOSITION AND USES OF THE SAME

(71) Applicant: TAIWAN UNION TECHNOLOGY CORPORATION, Chupei (TW)

(72) Inventors: Chih-Wei Liao, Chupei (TW); Guan-Syun Tseng, Chupei (TW); Chen-Hua Yu, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 5 days.

(21) Appl. No.: 16/447,748

(22) Filed: Jun. 20, 2019

(65) Prior Publication Data
US 2020/0291228 A1    Sep. 17, 2020

(30) Foreign Application Priority Data

Mar. 12, 2019 (TW) ................................ 108108239

(51) Int. Cl.
| C08L 71/12 | (2006.01) |
| C08K 5/00 | (2006.01) |
| C08K 3/013 | (2018.01) |
| C08K 3/04 | (2006.01) |
| C08K 3/36 | (2006.01) |
| H05K 1/03 | (2006.01) |
| C08K 7/10 | (2006.01) |
| C08K 7/20 | (2006.01) |
| C08J 5/24 | (2006.01) |
| C08K 5/14 | (2006.01) |
| C08L 27/18 | (2006.01) |

(52) U.S. Cl.
CPC ............... *C08L 71/12* (2013.01); *C08J 5/24* (2013.01); *C08K 3/013* (2018.01); *C08K 3/041* (2017.05); *C08K 3/36* (2013.01); *C08K 5/0066* (2013.01); *C08K 5/14* (2013.01); *C08K 7/10* (2013.01); *C08K 7/20* (2013.01); *H05K 1/0313* (2013.01); *C08L 27/18* (2013.01); *C08L 2203/206* (2013.01)

(58) Field of Classification Search
CPC ........................... C08K 5/14; C08L 71/12–126
See application file for complete search history.

(56) References Cited

U.S. PATENT DOCUMENTS

| 5,218,030 | A | 6/1993 | Katayose et al. |
| 5,352,754 | A | 10/1994 | Rhodes et al. |
| 6,352,782 | B2 | 3/2002 | Yeager et al. |
| 6,995,195 | B2 | 2/2006 | Ishii et al. |
| 2016/0280913 | A1 | 9/2016 | Liu et al. |
| 2016/0289446 | A1* | 10/2016 | Endo ................... C08K 5/14 |
| 2020/0165446 | A1* | 5/2020 | Liao ................... H05K 1/0373 |

FOREIGN PATENT DOCUMENTS

CN    109438960 A    3/2019

* cited by examiner

*Primary Examiner* — Ana L. Woodward
(74) *Attorney, Agent, or Firm* — Christensen, Fonder, Dardi & Herbert PLLC

(57) ABSTRACT

A resin composition comprising the following constituents:
(A) a polyphenylene ether resin with unsaturated end groups;
(B) a constituent with a maleimide structure;
(C) a first initiator, which has a first one-minute half-life temperature; and
(D) a second initiator, which has a second one-minute half-life temperature,
wherein the first one-minute half-life temperature is 20° C. to 50° C. higher than the second one-minute half-life temperature, and the first one-minute half-life temperature is 170° C. to 220° C.

19 Claims, No Drawings

RESIN COMPOSITION AND USES OF THE SAME

CLAIM FOR PRIORITY

This application claims the benefit of Taiwan Patent Application No. 108108239 filed on Mar. 12, 2019, the subject matters of which are incorporated herein in their entirety by reference.

BACKGROUND OF THE INVENTION

Field of the Invention

The present invention provides a resin composition, especially a polyphenylene ether-based resin composition that comprises two initiators with specific half-life temperatures. The resin composition of the present invention can be used in combination with reinforced materials to constitute a composite or a prepreg. Furthermore, the resin composition of the present invention can be used as a metal foil adhesive to manufacture a metal-clad laminate and a printed circuit board (PCB).

Descriptions of the Related Art

Metal-clad laminates are common materials used for manufacturing printed circuit boards and can be prepared using the following method. First, a reinforcing material (e.g., a glass-fiber fabric) is impregnated with a thermal-curable resin composition (e.g., a polyphenylene ether-based resin composition) or a thermal-curable resin composition is coated onto a reinforcing material. The resin composition-impregnated or resin composition-coated reinforcing material is cured to a semi-cured state (known as B-stage) to obtain a prepreg. Afterwards, a predetermined number of prepregs are superimposed to provide a dielectric layer. A metal foil (e.g., a copper foil) is superimposed on at least one external surface of the dielectric layer to provide a superimposed object. Then, the superimposed object is subjected to a hot-pressing operation (known as C-stage) to obtain a metal-clad laminate.

Recently, in the field of electronic telecommunications, electronic products are designed to operate at ever-higher frequencies and speeds due to the demand for more data transmission. In light of the trends of high-frequency and high-speed signal transmission, miniaturization of electronic elements, and high-density wirings of circuit boards, the requirements for the dielectric properties and storage stability of the related electronic materials have become stricter. A PCB is usually formed as a multi-layer structure to allow for as much wiring as possible to obtain a high-density PCB. A multi-layer board (i.e., a PCB with a multi-layer structure) can be prepared in the following manner. First, an appropriate conductive material (e.g., a metal foil) is pressed together with a dielectric material (e.g., a prepreg) to form a core layer, and the core layer is patterned. Then, an appropriate conductive material (e.g., a metal foil) is used in combination with a dielectric material (e.g., a prepreg) to form a build-up structure. The build-up structures are stacked sequentially and pressed onto the core layer and then also patterned to form a multi-layer board. The above manner is also known as the build-up method. However, since the processing time needed for the build-up method is long, if the dielectric material (e.g., a prepreg) has poor storage stability, the prepreg can age (i.e., have excessively high dynamic viscosity) due to a certain amount of cross-linking reaction that occurs. As a result, the prepreg is unable to securely bind with the metal foil. In addition, if the prepreg needs a longer pressing time to reach a fully-cured state during the pressing process, there is an increase in the processing time and thus, a rise in the process cost and a reduction in the yield.

SUMMARY OF THE INVENTION

The present invention provides a thermal-curable resin composition as well as a prepreg, metal-clad laminate and printed circuit board prepared by using the resin composition. The technical means of the present invention for solving the problems is to utilize two initiators in a polyphenylene ether-based resin composition, wherein the two initiators have different half-life temperatures and the difference between their half-life temperatures falls within the designated range. The prepreg prepared by using the resin composition of the present invention can be prevented from aging even after long-term storage. In addition, the prepreg can be provided with a suitable dynamic viscosity, thereby, giving it excellent storage stability. Further, when using the prepreg thus prepared to manufacture a metal-clad laminate, a shortened pressing time is needed, and thus, the process cost can be reduced and the yield can be increased. In addition, the electronic materials prepared from the resin composition of the present invention can be provided with satisfactory dielectric properties and thermal resistance. Thus, the present invention involves the following inventive objectives.

An objective of the present invention is to provide a resin composition, which comprises the following constituents:

(A) a polyphenylene ether resin with unsaturated end groups;

(B) a constituent with a maleimide structure;

(C) a first initiator, which has a first one-minute half-life temperature $T_{1,1/2}$; and (D) a second initiator, which has a second one-minute half-life temperature $T_{2,1/2}$, wherein $T_{1,1/2}$ is 170° C. to 220° C. and $T_{1,1/2}$ is 20° C. to 50° C. higher than $T_{2,1/2}$.

In some embodiments of the present invention, $T_{1,1/2}$ is 170° C. to 190° C. and $T_{1,1/2}$ is 21° C. to 35° C. higher than $T_{2,1/2}$.

In some embodiments of the present invention, the weight ratio of the first initiator (C) to the second initiator (D) is 6:1 to 1:6, preferably 6:1 to 3:4, and more preferably 6:1 to 4:3.

In some embodiments of the present invention, the polyphenylene ether resin (A) with unsaturated end groups is represented by the following formula (I):

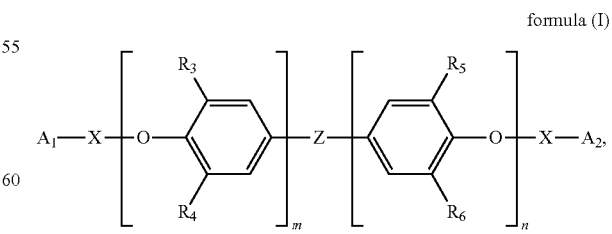

formula (I)

in formula (I), $R_3$, $R_4$, $R_5$, and $R_6$ are independently H or a substituted or unsubstituted C1-C5 alkyl, and $R_3$, $R_4$, $R_5$, and $R_6$ are preferably —$CH_3$;

m and n are independently an integer ranging from 0 to 100, with the proviso that m and n are not 0 at the same time;

Z is absent, —O—,

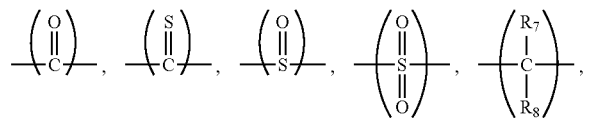

or an aryl, wherein $R_7$ and $R_8$ are independently H or a C1-C12 alkyl, and Z is preferably

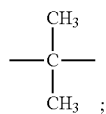

X and Y are independently absent, a carbonyl group, or an alkenyl-containing group, and X and Y are preferably absent; and $A_1$ and $A_2$ are independently

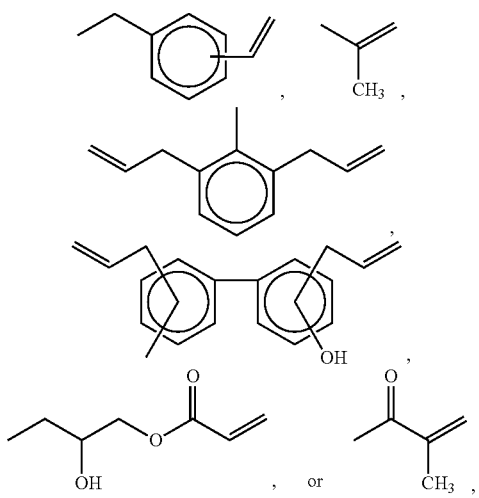

and $A_1$ and $A_2$ are preferably

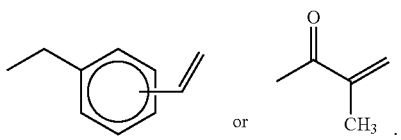

In some embodiments of the present invention, the constituent (B) with a maleimide structure is selected from the group consisting of 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, 3,3'-dimethyl-5,5'-diethyl-4,4'-diphenylmethylbismaleimide, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide, N,N'-methylene bis (3-chloro-p-phenylene)bismaleimide, and combinations thereof.

In some embodiments of the present invention, the first initiator (C) is selected from the group consisting of n-butyl 4,4-bis(tert-butylperoxy)valerate (one-minute half-life temperature $T_{1/2,\ 1\ min}$: 172.5° C.), tert-butylcumyl peroxide ($T_{1/2,\ 1\ min}$: 173.3° C.), dicumyl peroxide ($T_{1/2,\ 1\ min}$: 175.2° C.) 1,3-di-(2-tert-butyl-peroxyisopropyl)benzene ($T_{1/2,\ 1\ min}$: 175.4° C.), 2,5-dimethyl-2,5-di-(tert-butylperoxy)hexane ($T_{1/2,\ 1\ min}$: 179.8° C.), di-tert-butyl peroxide ($T_{1/2,\ 1\ min}$: 185.9° C.), 2,5-dimethyl-2,5-di(tert-butylperoxy)-3-hexyne ($T_{1/2,\ 1\ min}$: 194.3° C.), diisopropylbenzene hydroperoxide ($T_{1/2,\ 1\ min}$: 207° C.), p-menthane hydroperoxide ($T_{1/2,\ 1\ min}$: 199.5° C.), and combinations thereof.

In some embodiments of the present invention, the second initiator (D) is selected from the group consisting of 1,1,3,3-tetramethylbutylperoxy-2-ethylhexanoate ($T_{1/2,\ 1\ min}$: 124.3° C.), tert-amylperoxy-2-ethylhexanoate ($T_{1/2,\ 1\ min}$: 128° C.), dibenzoyl peroxide ($T_{1/2,\ 1\ min}$: 130° C.), tert-hexylperoxy-2-ethylhexanoate ($T_{1/2,\ 1\ min}$: 132.6° C.), tert-butylperoxy-2-ethylhexanoate ($T_{1/2,\ 134}$° C.), tert-butylperoxyisobutyrate ($T_{1/2,\ 1\ min}$: 136° C.), 1,1-di(tert-butylperoxy)-3,3,5-trimethylcyclhexane ($T_{1/2,\ 1\ min}$: 148° C.), 1,1-di(tert-hexylperoxy)cyclohexane ($T_{1/2,\ 1\ min}$: 149.2° C.), tert-amylperoxy-2-ethyl hexylcarbonate ($T_{1/2,\ 1\ min}$: 151° C.), 1,1-di(tert-butylperoxy)cyclohexane ($T_{1/2,\ 1\ min}$: 153.8° C.), tert-butylperoxyisopropylcarbonate ($T_{1/2,\ 1\ min}$: 158.8° C.), 2,2-di(tert-butylperoxy)butane ($T_{1/2,\ 1\ min}$: 159.9° C.), tert-butylperoxy acetate ($T_{1/2,\ 1\ min}$: 159.9° C.), tert-butylperoxy-2-ethylhexylcarbonate ($T_{1/2,\ 1\ min}$: 161.4° C.), tert-butylperoxy-3,3,5-trimethylhexanoate ($T_{1/2,\ 1\ min}$: 166° C.), tert-butylperoxybenzoate ($T_{1/2,\ 1\ min}$: 166.8° C.), di-tert-amyl peroxide ($T_{1/2,\ 1\ min}$: 169° C.), tert-butylcumyl peroxide, dicumyl peroxide, 1,3-di-(2-tert-butyl-peroxyisopropyl)benzene, 2,5-dimethyl-2,5-di-(tert-butylperoxy)hexane, di-tert-butyl peroxide, 2,5-dimethyl-2,5-di(tert-butylperoxy)-3-hexyne, and combinations thereof.

In some embodiments of the present invention, the resin composition further comprises a cross-linking agent selected from the group consisting of polyfunctional allylic compounds, polyfunctional acrylates, polyfunctional acrylamides, polyfunctional styrenic compounds, and combinations thereof.

In some embodiments of the present invention, the resin composition further comprises a flame retardant selected from the group consisting of phosphorus-containing flame retardants, bromine-containing flame retardants, nitrogen-containing compounds, and combinations thereof.

In some embodiments of the present invention, the resin composition further comprises a filler selected from the group consisting of silica, magnesium oxide, magnesium hydroxide, calcium carbonate, talc, clay, aluminum nitride, aluminum oxide, aluminum hydroxide, boron nitride, silicon nitride, silicon aluminum carbide, silicon carbide, sodium carbonate, magnesium carbonate, titanium dioxide, zinc oxide, zirconium oxide, quartz, diamond powders, diamond-like powders, graphite, calcined kaolin, pryan, mica, hydrotalcite, polytetrafluoroethylene (PTFE) powders, glass beads, ceramic whiskers, carbon nanotubes, nanosized inorganic powders, and combinations thereof.

Another objective of the present invention is to provide a prepreg, which is prepared by impregnating a substrate with the resin composition described above or by coating the resin composition described above onto a substrate and drying the impregnated or coated substrate.

Yet another objective of the present invention is to provide a metal-clad laminate, which is prepared by laminating the prepreg described above and a metal foil.

Still another objective of the present invention is to provide a printed circuit board, which is prepared from the metal-clad laminate described above.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENTS

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, the expressions "first", "second" or the like recited in the specification (especially in the claims) are merely used to distinguish the illustrated elements or constituents without special meanings. Those expressions do not intended to represent any priority.

Unless it is additionally explained, while describing the constituents in the solution, mixture and composition in the specification, the amount of each constituent is calculated based on the solid content, i.e., regardless of the weight of the solvent.

As used herein, the term "resin solid constituent" refers to all the other solid constituents excluding fillers in the resin composition. That is, the resin solid constituent includes the polyphenylene ether resin (A) with unsaturated end groups, the constituent (B) with a maleimide structure, the first initiator (C), and the second initiator (D) as necessary constituents, and other optional constituents (for example, a cross-linking agent and a flame retardant).

Compared to the prior art, the distinguishing features of the present invention lies in that the resin composition of the present invention uses a polyphenylene ether resin, a constituent with a maleimide structure, and two initiators with a specific half-life temperature difference in combination to impart the prepreg prepared by the resin composition with good storage stability and a shortened required pressing time, so that the process cost can be decreased and the yield can be increased. Also, the electronic material prepared by the prepreg can be provided with satisfactory dielectric properties and thermal resistance. The constituents and preparation method of the resin composition of the present invention are described in detail in the following.

1. Resin Composition

The resin composition of the present invention comprises the polyphenylene ether resin (A) with unsaturated end groups, the constituent (B) with a maleimide structure, the first initiator (C) and the second initiator (D) as necessary constituents, and other optional constituents that may be used depending on the need.

1.1. Polyphenylene Ether Resin (A) with Unsaturated End Groups

As used herein, the polyphenylene ether resin with unsaturated end groups refers to a resin with at least a repeating unit

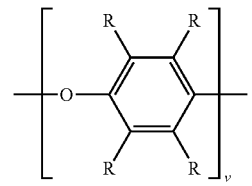

in the main chain and with unsaturated groups at the ends, wherein each R is independently H or a C1-C5 alkyl, and v is an integer ranging from 1 to 100. The unsaturated group refers to a group capable of carrying out an addition polymerization reaction with other constituents having unsaturated groups. The addition polymerization reaction can be initiated by light or heat in the presence of a polymerization initiator. Examples of unsaturated groups include but are not limited to vinyl, vinyl benzyl, allyl, an acrylate group, and a methacrylate group. Examples of the polyphenylene ether resin with unsaturated end groups include but are not limited to a vinyl-containing polyphenylene ether resin, an allyl-containing polyphenylene ether resin, a vinyl benzyl-containing polyphenylene ether resin, an acrylate group-containing polyphenylene ether resin and a methacrylate group-containing polyphenylene ether resin. Each of the polyphenylene ether resins with unsaturated end groups can either be used alone or in any combination.

The method for preparing the polyphenylene ether resin with unsaturated end groups is not the technical point of the present invention, and people having ordinary skill in the art can carry out the method based on the disclosure of the present invention and ordinary skill. Thus, the method for preparing the polyphenylene ether resin with unsaturated end groups will not be described in detail herein. The related methods for preparing the polyphenylene ether resin with unsaturated end groups are described in, for example, U.S. Pat. No. 6,995,195 B2 for vinyl benzyl-containing polyphenylene ether resins, U.S. Pat. No. 5,218,030 A for allyl-containing polyphenylene ether resins, U.S. Pat. No. 5,352,754 A for methacrylate group-containing polyphenylene ether resins, U.S. Pat. No. 6,352,782 B2, and US 2016/0280913 A1, all of which are incorporated herein in their entireties by reference.

In some embodiments of the present invention, the polyphenylene ether resin (A) with unsaturated end groups is represented by the following formula (I):

formula (I)

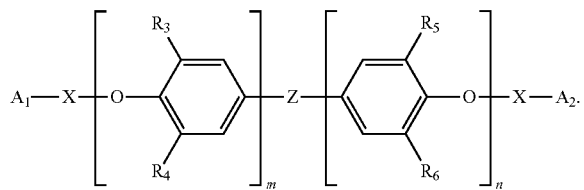

In formula (I), $R_3$, $R_4$, $R_5$, and $R_6$ are independently H or a substituted or unsubstituted C1-C5 alkyl; m and n are independently an integer ranging from 0 to 100, with the proviso that m and n are not 0 at the same time; Z is absent, —O—,

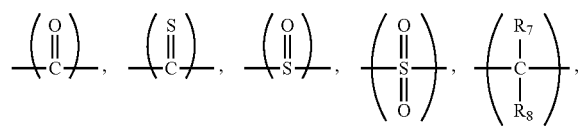

or an aryl, wherein $R_7$ and $R_8$ are independently H or a C1-C12 alkyl; X and Y are independently absent, a carbonyl group, or an alkenyl-containing group; and $A_1$ and $A_2$ are independently

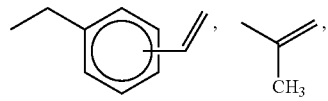

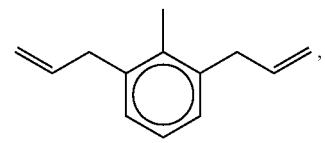

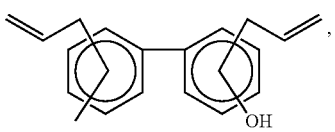

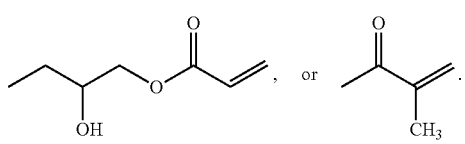

In the preferred embodiment of the present invention, in formula (I), $R_3$, $R_4$, $R_5$, and $R_6$ are —$CH_3$; Z is

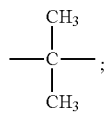

X and Y are absent; and $A_1$ and $A_2$ are independently

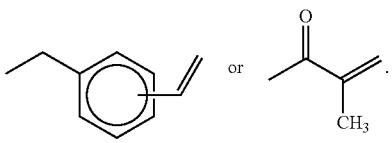

In the resin composition of the present invention, the weight average molecular weight (Mw) of the polyphenylene ether resin (A) with unsaturated end groups can range from 1000 to 50000, preferably from 1000 to 10000, and more preferably from 1000 to 5000. If the Mw of the polyphenylene ether resin is above the aforementioned range (e.g., above 50000), the properties of the resin composition, such as fluidity, solubility, etc., may deteriorate, which makes it difficult for the subsequent processing. On the contrary, if the Mw of the polyphenylene ether resin is below the aforementioned range (e.g., below 1000), the dielectric properties and thermal stability of the resin composition may deteriorate.

Examples of commercially available polyphenylene ether resin (A) with unsaturated end groups include products with trade names OPE-2st and OPE-2EA available from MITSUBISHI GAS CHEMICAL, products with trade name SA-9000 available from SABIC, products with trade name PP807 available from Chin Yee Chemical Industry, and a polyphenylene ether resin product available from ASAHI KASEI.

In the resin composition of the present invention, based on 100 parts by weight of the resin solid constituent, the content of the polyphenylene ether resin (A) with unsaturated end groups can range from 20 parts by weight to 70 parts by weight, and more particularly from 25 parts by weight to 65 parts by weight, such as 27 parts by weight, 30 parts by weight, 33 parts by weight, 35 parts by weight, 38 parts by weight, 40 parts by weight, 42 parts by weight, 45 parts by weight, 47 parts by weight, 50 parts by weight, 53 parts by weight, 55 parts by weight, 58 parts by weight, 60 parts by weight, or 63 parts by weight.

1.2. Constituent (B) with a Maleimide Structure

As used herein, a maleimide structure refers to an unsaturated imide structure with reactive double bond(s). The constituent with a maleimide structure is capable of carrying out reactions with other constituents having unsaturated groups due to reactive double bond(s). In some embodiments of the present invention, the constituent (B) with a maleimide structure includes one or more compounds represented by the following formula (II):

formula (II)

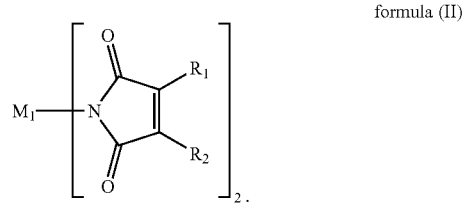

In formula (II), $M_1$ is an organic group, and $R_1$ and $R_2$ are independently H, halogen, or a C1-C5 alkyl. Specifically, $M_1$ is a C2-C40 divalent group, and the divalent group includes but is not limited to a divalent aliphatic group, a divalent alicyclic group, a divalent aromatic group, and a divalent heterocyclic group. In the preferred embodiment of the present invention, $R_1$ and $R_2$ are H, and $M_1$ is selected from the group consisting of methylene (—$CH_2$—), 4,4'-diphenylmethane group

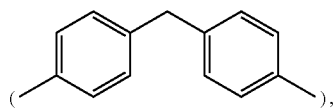

m-phenylene

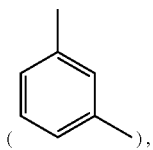

bisphenol A diphenyl ether group

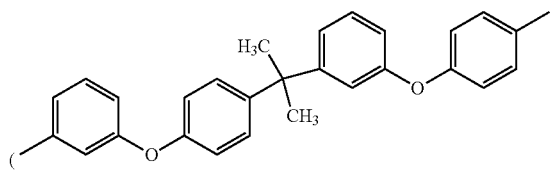

3,3'-dimethyl-5,5'-diethyl-4,4'-diphenylmethane group

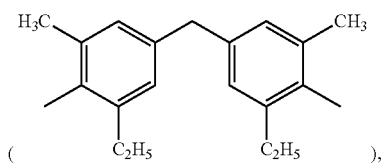

4-methyl-1,3-phenylene

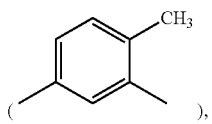

and (2,2,4-trimethyl)-1,6-hexylene

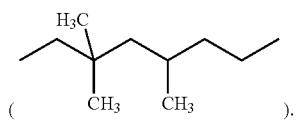

Specific examples of the compound represented by formula (II) include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, 3,3'-dimethyl-5,5'-diethyl-4,4'-diphenylmethylbismaleimide, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide, and N,N'-methylene bis(3-chloro-p-phenylene)bismaleimide. Each of the compounds can either be used alone or in any combination. In the appended examples, 3,3'-dimethyl-5,5'-diethyl-4,4'-diphenylmethyl bismaleimide (that is, in formula (II), $R_1$ and $R_2$ are H, and $M_1$ is 3,3'-dimethyl-5,5'-diethyl-4,4'-diphenylmethane group

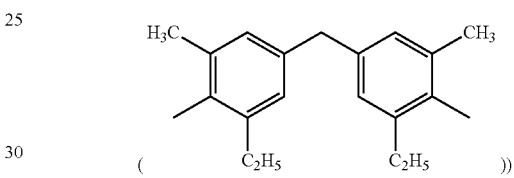

is used.

In the resin composition of the present invention, based on 100 parts by weight of the resin solid constituent, the content of the constituent (B) with a maleimide structure can range from 20 parts by weight to 70 parts by weight, and more particularly from 25 parts by weight to 65 parts by weight, such as 27 parts by weight, 30 parts by weight, 33 parts by weight, 35 parts by weight, 38 parts by weight, 40 parts by weight, 42 parts by weight, 45 parts by weight, 48 parts by weight, 50 parts by weight, 52 parts by weight, 55 parts by weight, 58 parts by weight, 60 parts by weight, or 62 parts by weight.

1.3. First Initiator (C) and Second Initiator (D)

Although a polymerization reaction can be initiated by heat without the presence of a polymerization initiator, a polymerization reaction without a polymerization initiator is carried out at an extremely high temperature. However, in view of the limitation on temperature, it is difficult to conduct a polymerization reaction without a polymerization initiator under the industry processing conditions used for common electronic materials. Thus, under the industry processing conditions used for common electronic materials, the polymerization reaction is usually carried out in the presence of a polymerization initiator. As used herein, initiators refer to substances capable of initiating a polymerization reaction and can be generally classified into photoinitiators and thermal-initiators. Examples of photoinitiators include but are not limited to onium salts, diazonium salts, benzoin ethers, aromatic ketones, and metal organic compounds. Examples of thermal-initiators include but are not limited to organic peroxide compounds and azo compounds. Organic peroxides are thermally unstable substances, whose decomposition may be readily accelerated along with the rising temperatures. Thus, the reaction characteristics of organic peroxides may often be represented by a "half-life temperature". Specifically, the half-life temperature can be classified into a one-minute half-life temperature, a one-hour half-life temperature, and a ten-hour half-life temperature in accordance with the decomposition time. Among which, a one-minute half-life temperature means that the amount of organic peroxide will decompose to half of the original amount within one minute under such temperature.

The one-minute half-life temperatures of organic peroxides can be measured in accordance with the conventional methods known by persons having ordinary skill in the art. Specifically, an organic peroxide can be dissolved into an inert solvent to form an organic peroxide solution with a concentration of 0.1 mol/L. Then, the temperature at which the decomposition amount of the organic peroxide achieves 50% of the original amount is measured by differential scanning calorimetry-thermal activity monitoring (DSC-TAM). The inert solvent used in the measurement can be benzene or chlorobenzene.

The resin composition of the present invention uses two different initiators in combination to improve the storage stability and reduce the required pressing time of the prepreg thus prepared, wherein the initiator with the higher one-minute half-life temperature is called a first initiator (C) and the initiator with the lower one-minute half-life temperature is called a second initiator (D). The first initiator (C) has a first one-minute half-life temperature $T_{1,1/2}$ ranging between 170° C. and 220° C., preferably between 170° C. and 210° C., and more preferably between 170° C. and 190° C. The second initiator (D) has a second one-minute half-life temperature $T_{2,1/2}$ that is 20° C. to 50° C. lower than $T_{1,1/2}$. In other words, $T_{1,1/2}$ is 20° C. to 50° C. higher than $T_{2,1/2}$. In the preferred embodiment of the present invention, $T_{1,1/2}$ is 21° C. to 35° C. higher than $T_{2,1/2}$, for example, $T_{1,1/2}$ is 22° C., 23° C., 24° C., 25° C., 26° C., 27° C., 28° C., 29° C., 30° C., 31° C., 32° C., 33° C., or 34° C. higher than $T_{2,1/2}$. When $T_{1,1/2}$ falls within the designated range and the difference between $T_{1,1/2}$ and $T_{2,1/2}$ also falls within the designated range, the prepreg prepared from the resin composition can be provided with excellent storage stability and a shortened required pressing time. That is, an appropriate balance between the storage stability and required pressing time can be achieved. On the contrary, when $T_{1,1/2}$ falls outside the designated range or the difference between $T_{1,1/2}$ and $T_{2,1/2}$ falls outside the designated range, the prepreg prepared from the resin composition is incapable of simultaneously being provided with excellent storage stability and a shortened required pressing time. That is, no appropriate balance between the storage stability and required pressing time can be achieved.

Examples of the first initiator (C) include but are not limited to n-butyl 4,4-bis(tert-butylperoxy)valerate ($T_{1/2, 1\ min}$: 172.5° C.), tert-butylcumyl peroxide ($T_{1/2, 1\ min}$: 173.3° C.), dicumyl peroxide ($T_{1/2, 1\ min}$: 175.2° C.), 1,3-di-(2-tert-butyl-peroxyisopropyl) benzene ($T_{1/2, 1\ min}$: 175.4° C.), 2,5-dimethyl-2,5-di-(tert-butylperoxy)hexane ($T_{1/2, 1\ min}$: 179.8° C.), di-tert-butyl peroxide ($T_{1/2, 1\ min}$: 185.9° C.), 2,5-dimethyl-2,5-di(tert-butylperoxy)-3-hexyne ($T_{1/2, 1\ min}$: 194.3° C.), diisopropylbenzene hydroperoxide ($T_{1/2, 1\ min}$: 207° C.), and p-menthane hydroperoxide ($T_{1/2, 1\ min}$: 199.5° C.). Each of the initiators can either be used alone or in any combination.

Examples of the second initiator (D) include but are not limited to 1,3,3-tetramethylbutylperoxy-2-ethylhexanoate ($T_{1/2, 1\ min}$:124.3° C.), tert-amylperoxy-2-ethylhexanoate ($T_{1/2, 1\ min}$: 128° C.), dibenzoyl peroxide ($T_{1/2, 1\ min}$: 130° C.), tert-hexylperoxy-2-ethylhexanoate ($T_{1/2, 1\ min}$: 132.6° C.), tert-butylperoxy-2-ethylhexanoate ($T_{1/2, 1\ min}$: 134° C.), tert-butylperoxyisobutyrate ($T_{1/2, 1\ min}$:136° C.), 1,1-di(tert-butylperoxy)-3,3,5-trimethylcyclhexane ($T_{1/2, 1\ min}$: 148° C.), 1,1-di(tert-hexylperoxy)cyclhexane ($T_{1/2, 1\ min}$: 149.2° C.), tert-amylperoxy-2-ethyl hexylcarbonate ($T_{1/2, 1\ min}$: 151° C.), 1,1-di(tert-butylperoxy)cyclohexane ($T_{1/2, 1\ min}$: 153.8° C.), tert-butylperoxyisopropylcarbonate ($T_{1/2, 1\ min}$: 158.8° C.), 2,2-di(tert-butylperoxy)butane ($T_{1/2, 1\ min}$: 159.9° C.), tert-butylperoxyacetate ($T_{1/2, 1\ min}$: 159.9° C.), tert-butylperoxy-2-ethylhexylcarbonate ($T_{1/2, 1\ min}$: 161.4° C.), tert-butylperoxy-3,3,5-trimethylhexanoate ($T_{1/2, 1\ min}$: 166° C.), tert-butylperoxybenzoate ($T_{1/2, 1\ min}$: 166.8° C.), di-tert-amyl peroxide ($T_{1/2, 1\ min}$: 169° C.), tert-butylcumyl peroxide, dicumyl peroxide, 1,3-di-(2-tert-butyl-peroxyisopropyl)benzene, 2,5-dimethyl-2,5-di-(tert-butylperoxy)hexane, di-tert-butyl peroxide, and 2,5-dimethyl-2,5-di(tert-butylperoxy)-3-hexyne. Each of the initiators can either be used alone or in any combination.

In some embodiments of the present invention, the first initiator (C) is selected from the group consisting of 1,3-di-(2-tert-butyl-peroxyisopropyl) benzene, di-tert-butyl peroxide, diisopropylbenzene hydroperoxide, and 2,5-dimethyl-2,5-di(tert-butylperoxy)-3-hexyne.

In some embodiments of the present invention, the second initiator (D) is selected from the group consisting of 1,1-di(tert-butylperoxy)cyclhexane, tert-butylperoxy-2-ethylhexylcarbonate, 1,1-di(tert-hexylperoxy)cyclhexane, and dibenzoyl peroxide.

In the resin composition of the present invention, based on 100 parts by weight of the resin solid constituent, the total content of the first initiator (C) and the second initiator (D) can range from 0.01 parts by weight to 2 parts by weight, such as 0.02 parts by weight, 0.03 parts by weight, 0.05 parts by weight, 0.07 parts by weight, 0.09 parts by weight, 0.1 parts by weight, 0.2 parts by weight, 0.3 parts by weight, 0.5 parts by weight, 0.7 parts by weight, 0.9 parts by weight, 1 parts by weight, 1.2 parts by weight, 1.3 parts by weight, 1.5 parts by weight, or 1.8 parts by weight.

In the resin composition of the present invention, the weight ratio of the first initiator (C) to the second initiator (D) can range from 6:1 to 1:6, preferably from 6:1 to 3:4, and more preferably from 6:1 to 4:3, such as 5:1, 4:1, 3:1, 5:2, 2:1, 5:3, or 3:2. When the weight ratio of the first initiator (C) to the second initiator (D) falls within the designated range, the prepreg prepared from the resin composition can be provided with better storage stability and a shortened required pressing time.

1.4. Other Optional Constituents

The resin composition of the present invention may, depending on the need, further comprise other optional constituents, such as cross-linking agents, flame retardants, and fillers that are illustrated below, as well as additives known in this technical field, to adaptively improve the workability of the resin composition during manufacturing or improve the physicochemical properties of the electronic materials prepared from the resin composition. Additives known in this technical field include but are not limited to elastomers, co-cross-linking agents, and curing promoters.

[Cross-Linking Agent]

As used herein, cross-linking agents refer to constituents that have unsaturated groups and can react with the polyphenylene ether resin and the constituent with a maleimide structure to carry out a cross-linking reaction to form a steric network structure. The unsaturated groups are as those defined above. In the resin composition of the present invention, the cross-linking agents preferably have good compatibility with the polyphenylene ether resin and the constituent with a maleimide structure, such that the formed resin composition can have a good appearance after curing. In general, cross-linking agents may be classified into monofunctional cross-linking agents and polyfunctional cross-linking agents, depending on the quantities of the unsaturated groups contained therein, wherein a monofunctional cross-linking agent has only one unsaturated group, while a polyfunctional cross-linking agent has at least two unsaturated groups. In some embodiments of the present invention, a polyfunctional cross-linking agent is used to give a resin composition a higher cross-linking density after curing.

Specifically, examples of cross-linking agents include but are not limited to polyfunctional allylic compounds, polyfunctional acrylates, polyfunctional acrylamides, and polyfunctional styrenic compounds. Each of the cross-linking agents can either be used alone or in any combination.

The polyfunctional allylic compound refers to a compound containing at least two allyl groups. Examples of polyfunctional allylic compounds include but are not limited to diallyl phthalate, diallyl isophthalate, triallyl trimellitate, triallyl mesate, triallyl isocyanurate (TAIC), triallyl cyanurate (TAC), and prepolymers thereof.

The polyfunctional acrylate refers to a compound containing at least two acrylate groups.

Examples of polyfunctional acrylates include but are not limited to trimethylolpropane tri(meth)acrylate, 1,6-hexanediol di(meth)acrylate, ethyleneglycol di(meth)acrylate, propyleneglycol di(meth)acrylate, 1,3-butanediol di(meth)acrylate, 1,4-butanediol di(meth)acrylate, cyclohexane dimethanol di(methyl)acrylate, diethylene glycol di(meth)acrylate, triethylene glycol di(meth)acrylate, and prepolymers containing compounds thereof.

The polyfunctional styrenic compound refers to a compound with at least two alkenyl groups attached to the aromatic ring. Examples of the polyfunctional styrenic compound include but are not limited to 1,3-divinylbenzene, 1,4-divinylbenzene, trivinylbenzene, 1,3-diisopropenylbenzene, 1,4-diisopropenylbenzene, 1,2-bis(p-vinylphenyl)ethane, 1,2-bis(m-vinylphenyl)ethane, 1-(p-vinylphenyl)-2-(m-vinylphenyl)-ethane, 1,4-bis(p-vinylphenylethyl)benzene, 1,4-bis(m-vinylphenylethyl)benzene, 1,3-bis(p-vinylphenylethyl)benzene, 1,3-bis(m-vinylphenylethyl)benzene, 1-(p-vinylphenylethyl)-4-(m-vinylphenylethyl) benzene, 1-(p-vinylphenylethyl)-3-(m-vinylphenylethyl)benzene, and prepolymers containing compounds thereof.

Considering the compatibility among the constituents in the resin composition, the cross-linking is preferably selected from the group consisting of TAIC, TAC, 1,3-divinylbenzene, 1,4-divinylbenzene, 1,2-bis(p-vinylphenyl)ethane, 1,2-bis(m-vinylphenyl)ethane, 1-(p-vinylphenyl)-2-(m-vinylphenyl)-ethane, and combinations thereof. In the appended examples, TAIC is used as the cross-linking agent.

In the resin composition of the present invention, based on 100 parts by weight of the resin solid constituent, the content of the cross-linking agent can range from 0 parts by weight to 40 parts by weight, particularly from 5 parts by weight to 35 parts by weight, such as 7 parts by weight, 10 parts by weight, 12 parts by weight, 15 parts by weight, 18 parts by weight, 20 parts by weight, 23 parts by weight, 25 parts by weight, 27 parts by weight, 30 parts by weight, or 32 parts by weight.

[Flame Retardant]

The resin composition may, depending on the need, further comprise flame retardants to enhance the thermal resistance and flame retardance of the electronic materials prepared from the resin composition. The types of flame retardants include but are not limited to a phosphorus-containing flame retardant, a bromine-containing flame retardant, and a nitrogen-containing compound. Each type of flame retardants can either be used alone or in any combination.

Examples of the phosphorus-containing flame retardant include but are not limited to phosphate esters, phosphazenes, ammonium polyphosphates, metal phosphinates, and melamine phosphates. Each of the phosphorus-containing flame retardants can either be used alone or in any combination. Examples of metal phosphinates include but are not limited to aluminum dialkylphosphinate, aluminum tris(diethylphosphinate), aluminum tris(methylethylphosphinate), aluminum tris(diphenylphosphinate), zinc bis(diethylphosphinate), zinc bis(methylethylphosphinate), zinc bis(diphenylphosphinate), titanyl bis(diethylphosphinate), titanyl bis(methylethylphosphinate), and titanyl bis(diphenylphosphinate). One commercially available metal phosphinate is OP935 available from CLARIANT.

Examples of the bromine-containing flame retardant include but are not limited to tetrabromobisphenol A, decabromodiphenyl oxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. Examples of the nitrogen-containing compound include but are not limited to melamine and derivatives thereof.

In the resin composition of the present invention, based on 100 parts by weight of the resin solid constituent, the content of the flame retardant can range from 0 parts by weight to 30 parts by weight, particularly from 5 parts by weight to 25 parts by weight, such as 7 parts by weight, 10 parts by weight, 12 parts by weight, 15 parts by weight, 18 parts by weight, 20 parts by weight, or 23 parts by weight, but is not limited thereto. Persons having ordinary skill in the art can adjust the amount of the flame retardant depending on the practical needs.

[Filler]

The resin composition may further comprise a filler to improve the mechanical strength, thermal conductivity and dimensional stability of the prepared electronic materials. Examples of suitable fillers include but are not limited to fillers selected from the group consisting of silica, magnesium oxide, magnesium hydroxide, calcium carbonate, talc, clay, aluminum nitride, aluminum oxide, aluminum hydroxide, boron nitride, silicon nitride, silicon aluminum carbide, silicon carbide, sodium carbonate, magnesium carbonate, titanium dioxide, zinc oxide, zirconium oxide, quartz, diamond powders, diamond-like powders, graphite, calcined kaolin, pryan, mica, hydrotalcite, PTFE powders, glass beads, ceramic whiskers, carbon nanotubes, nanosized inorganic powders, and combinations thereof.

In general, based on 100 parts by weight of the total solid content of the resin composition, the content of the filler can range from 0 parts by weight to 40 parts by weight, such as 5 parts by weight, 7 parts by weight, 10 parts by weight, 12 parts by weight, 15 parts by weight, 18 parts by weight, 20 parts by weight, 25 parts by weight, 30 parts by weight, or 35 parts by weight, but is not limited thereto. Persons having ordinary skill in the art can adjust the amount of the filler depending on the practical needs.

1.5. Preparation of Resin Composition

The resin composition of the present invention may be prepared into a varnish for subsequent processing by uniformly mixing the constituents of the resin composition, including a polyphenylene ether resin with unsaturated end groups, a constituent with a maleimide structure, a first initiator, a second initiator and other optional constituents, with a stirrer, and dissolving or dispersing the obtained mixture in a solvent. The said solvent can be any inert solvent that can dissolve or disperse the constituents of the resin composition but does not react with the constituents of the resin composition. For example, the solvent that can dissolve or disperse the constituents of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). Each of the mentioned solvents can either be used alone or in a mixture of two or more. The content of the solvent is not particularly limited so long as the constituents of the resin composition can be evenly dissolved or dispersed therein. In the appended examples, methyl ethyl ketone is used as the solvent.

2. Prepreg

The present invention also provides a prepreg prepared from the aforementioned resin composition, wherein the prepreg is prepared by impregnating a substrate with the aforementioned resin composition or by coating the aforementioned resin composition onto a substrate and drying the impregnated or coated substrate. The method for impregnating or coating resin compositions include but are limited to immersing, roll coating, die coating, bar coating, gravure coating, spin coating, slit coating, and spraying. The impregnated or coated substrate can be dried at a temperature of 80° C. to 180° C. for 1 to 20 minutes to obtain a semi-cured (B-stage) prepreg. In the appended examples, drying is performed at 175° C. for 2 to 15 minutes.

The ordinary substrates include but are not limited to papers, cloths or mats made from materials selected from the group consisting of paper fibers, glass fibers, quartz fibers, organic polymeric fibers, carbon fibers, and combinations thereof. Examples of the organic polymeric fibers include but are not limited to a high-modulus polypropylene (HMPP) fiber, a polyamide fiber, an ultra-high molecular weight polyethylene (UHMWPE) fiber, and a liquid crystal polymer (LCP). In some embodiments of the present invention, a glass fiber cloth is used as the substrate, such as an E-glass fiber cloth, an NE-glass fiber cloth, a Q-glass fiber cloth, a D-glass fiber cloth, an S-glass fiber cloth, and an L-glass fiber cloth. The glass fiber cloth may be a woven fabric or non-woven fabric. In the appended examples, an E-glass fiber cloth is used as a substrate.

3. Metal-Clad Laminate and Printed Circuit Board

The present invention also provides a metal-clad laminate prepared from the aforementioned prepreg, which comprises a synthetic layer and a metal layer, wherein the synthetic layer is provided by the aforementioned prepreg. Specifically, the metal-clad laminate of the present invention can be prepared by superimposing a plurality of the prepregs, superimposing a metal foil (such as a copper foil) on at least one external surface of the synthetic layer composed of the superimposed prepregs to provide a superimposed object comprising the synthetic layer and metal layer, and then, performing a hot-pressing operation onto the superimposed object to obtain the metal-clad laminate. The hot-pressing operation conditions were as follows: hot-pressing for 60 to 200 minutes under a pressure ranging from 5 kg/cm$^2$ to 15 kg/cm$^2$ at a temperature ranging from 180° C. to 220° C.

Furthermore, the aforementioned metal-clad laminate can form a printed circuit board by further patterning the external metal foil thereof.

4. Examples 4.1. Testing Methods

The present invention is further illustrated by the embodiments hereinafter, wherein the testing instruments and methods are as follows:

[Glass Transition Temperature (Tg) Test]

The glass transition temperature (Tg) of the metal-clad laminate is measured by using a Differential Scanning calorimeter (DSC), wherein the measuring methods are the IPC-TM-650.2.4.24C and 25C testing methods of the Institute for Interconnecting and Packaging Electronic Circuits (IPC). The cured extent of the metal-clad laminate prepared from the resin composition of the present invention can be determined through the measured Tg. Specifically, in a resin composition system that comprises a polyphenylene ether resin and a maleimide-based constituent as main constituents, the metal-clad laminate is deemed to reach a fully-cured state (i.e., C-stage) when the Tg of the metal-clad laminate reaches 220° C. In other words, if the Tg of the prepared metal-clad laminate does not reach 220° C. after hot-pressing for 120 minutes, it means that the metal-clad laminate does not reach a fully-cured state and a longer pressing time is required.

[Solder Resistance Test]

A solder resistance test is carried out by immersing the dried metal-clad laminate in a tin solder bath at 288° C. for 20 seconds, then taking it out, repeating the abovementioned immersing-taking out and observing whether there are any defects, such as delamination or blistering. The number of the immersion times of the metal-clad laminate is recorded in the event of a defect.

[Dielectric Constant (Dk) and Dissipation Factor (Df) Measurements]

The dielectric constant (Dk) and dissipation factor (Df) of the dielectric layer (with a resin content (RC) of 70%) are measured according to IPC-TM-650 2.5.5.13 under an operating frequency of 10 GHz. The dielectric layer is obtained by etching and removing the metal foils from the two surfaces of the metal-clad laminate.

[Dynamic Viscosity Test]

The prepreg that was just prepared and the prepregs that were stored respectively for 1 (one) week to 11 weeks are rubbed to obtain powders. 0.45 g of the powders are placed in a rheometer (model: HR-1, available from TA Instrument) to measure dynamic viscosity. The measuring interval between the prepregs stored respectively for 1 (one) week to 11 weeks is one week. That is, the dynamic viscosity is measured at the following times: stored for 1 (one) week, stored for 2 weeks, . . . stored for 10 weeks, stored for 11 weeks. The conditions for measurement are as follows: the heating rate is 2.5° C./min, the measured temperature range is from 50° C. to 180° C., and the lowest viscosity is recorded. The unit of the dynamic viscosity is "Pa·s"

4.2. List of Raw Materials Used in Examples and Comparative Examples

TABLE 1

List of Raw Materials

| Raw material, Model No. | Description |
|---|---|
| SA 9000 | Polyphenylene ether resin with unsaturated end groups, available from SABIC |
| BMI-70 | Constituent with a maleimide structure (BMI constituent), available from KI CHEMICAL |
| TAIC | Cross-linking agent, triallyl isocyanurate, available from Evonik |
| Perbutyl P | Initiator, 1,3-di-(2-tert-butyl-peroxyisopropyl)benzene, $T_{1/2,\ 1\ min}$: 175.4° C., available from NOF Corporation |
| Perbutyl D | Initiator, di-tert-butyl peroxide, $T_{1/2,\ 1\ min}$: 185.9° C., available from NOF Corporation |
| Peroxan IHP-50 | Initiator, diisopropylbenzene hydroperoxide, $T_{1/2,\ 1\ min}$: 207° C., available from PERGAN |
| Perhexyne 25B | Initiator, 2,5-dimethyl-2,5-di(tert-butylperoxy)-3-hexyne, $T_{1/2,\ 1\ min}$: 194.3° C., available from NOF Corporation |
| Perhexa C-79(S) | Initiator, 1,1-di(tert-butylperoxy)cyclohexane, $T_{1/2,\ 1\ min}$: 153.8° C., available from NOF Corporation |
| Perbutyl E | Initiator, tert-butylperoxy-2-ethylhexylcarbonate, $T_{1/2,\ 1\ min}$: 161.4° C., available from NOF Corporation |
| Perhexa HC | Initiator, 1,1-di(tert-hexylperoxy)cyclohexane, $T_{1/2,\ 1\ min}$: 149.2° C., available from NOF Corporation |
| Nyper BW | Initiator, dibenzoyl peroxide, $T_{1/2,\ 1\ min}$: 130° C., available from NOF Corporation |
| Peroxan CU-90L | Initiator, cumyl hydroperoxide, $T_{1/2,\ 1\ min}$: 222° C., available from PERGAN |
| 525ARI | $SiO_2$ filler, available from SIBELCO |
| OP-935 | Flame retardant, aluminium diethyl phosphinate, available from CLARIANT |
| MEK | Solvent, methyl ethyl ketone, available from TRANS CHIEF CHEMICAL |

4.3. Preparation of Resin Composition

The resin compositions of Examples 1 to 6 and Comparative Examples 1 to 8 were prepared according to the proportions shown in Tables 2-1 to 2-3. The constituents were mixed at room temperature by a stirrer. Then, MEK was added as the solvent. The resultant mixtures were stirred at room temperature for 60 to 120 minutes to obtain the resin compositions.

TABLE 2-1

Composition of the resin compositions of the Examples

| Unit: parts by weight | | Example 1 | 2 | 3 | 4 | 5 | 6 |
|---|---|---|---|---|---|---|---|
| Polyphenylene ether resin (A) | SA 9000 | 100 | 100 | 100 | 100 | 100 | 100 |
| BMI constituent (B) | BMI-70 | 100 | 100 | 100 | 100 | 100 | 100 |
| Cross-linking agent | TAIC | 70 | 70 | 70 | 70 | 70 | 70 |
| First initiator (C) | Perbutyl P | 0.6 | 0.4 | | | | |
| | Perbutyl D | | | 0.5 | | 0.3 | 0.3 |
| | Peroxan IHP-50 | | | | 0.4 | | |
| Second initiator (D) | Perhexa C-79 (S) | 0.1 | 0.3 | 0.2 | | 0.4 | |
| | Perbutyl E | | | | 0.3 | | |
| | Perhexa HC | | | | | | 0.4 |
| Flame retardant | OP-935 | 30 | 30 | 30 | 30 | 30 | 30 |
| Filler | 525ARI | 90 | 90 | 90 | 90 | 90 | 90 |
| Solvent | MEK | 200 | 200 | 200 | 200 | 200 | 200 |
| First initiator (C): Second initiator (D) (weight ratio) | | 6:1 | 4:3 | 5:2 | 4:3 | 3:4 | 3:4 |
| Difference between $T_{1,1/2}$ and $T_{2,1/2}$ (° C.) | | 21.6 | 21.6 | 32.1 | 45.6 | 32.1 | 36.7 |

TABLE 2-2

Composition of the resin compositions of Comparative Examples 1 to 4

| Unit: parts by weight | | Comparative Example 1 | 2 | 3 | 4 |
|---|---|---|---|---|---|
| Polyphenylene ether resin (A) | SA 9000 | 100 | 100 | 100 | 100 |
| BMI constituent (B) | BMI-70 | 100 | 100 | 100 | 100 |
| Cross-linking agent | TAIC | 70 | 70 | 70 | 70 |
| First initiator (C) | Perbutyl P | 0.7 | | | |
| | Perbutyl D | | | 0.6 | 0.4 |
| Second initiator (D) | Perhexa C-79 (S) | | 0.7 | | |
| | Nyper BW | | | 0.1 | 0.3 |
| Flame retardant | OP-935 | 30 | 30 | 30 | 30 |
| Filler | 525ARI | 90 | 90 | 90 | 90 |
| Solvent | MEK | 200 | 200 | 200 | 200 |
| First initiator (C):Second initiator (D) (weight ratio) | | 7:0 | 0:7 | 6:1 | 4:3 |
| Difference between $T_{1,\ 1/2}$ and $T_{2,\ 1/2}$ (° C.) | | | | 55.9 | 55.9 |

TABLE 2-3

Composition of the resin compositions of Comparative Examples 5 to 8

| Unit: parts by weight | | Comparative Example 5 | 6 | 7 | 8 |
|---|---|---|---|---|---|
| Polyphenylene ether resin (A) | SA 9000 | 100 | 100 | 100 | 100 |
| BMI constituent (B) | BMI-70 | 100 | 100 | 100 | 100 |
| Cross-linking agent | TAIC | 70 | 70 | 70 | 70 |

TABLE 2-3-continued

Composition of the resin compositions of Comparative Examples 5 to 8

| Unit: parts by weight | | Comparative Example | | | |
|---|---|---|---|---|---|
| | | 5 | 6 | 7 | 8 |
| First initiator (C) | Peroxan CU-90L | 0.4 | | | |
| | Perbutyl P | | | 0.5 | |
| | Perhexyne 25B | | | | 0.2 |
| | Perbutyl E | | 0.6 | | |
| Second initiator (D) | Perbutyl D | 0.3 | | | |
| | Nyper BW | | 0.1 | | |
| | Perbutyl E | | | 0.2 | |
| | Perbutyl P | | | | 0.5 |
| Flame retardant | OP-935 | 30 | 30 | 30 | 30 |
| Filler | 525ARI | 90 | 90 | 90 | 90 |
| Solvent | MEK | 200 | 200 | 200 | 200 |
| First initiator (C):Second initiator (D) (weight ratio) | | 4:3 | 6:1 | 5:2 | 2:5 |
| Difference between $T_{1,1/2}$ and $T_{2,1/2}$ (° C.) | | 36.1 | 31.4 | 14 | 18.9 |

4.4. Preparation and Property Measurements of Prepregs and Metal-Clad Laminates

Prepregs and metal-clad laminates were prepared respectively by using the resin compositions of Examples 1 to 6 and Comparative Examples 1 to 8. First, glass fiber cloths (Model No.: 2116; thickness: 0.09 mm) were immersed in the resin compositions of Examples 1 to 6 and Comparative Examples 1 to 8 respectively through roll coaters, and the thicknesses of the glass fiber cloths were controlled to a proper extent. The immersed glass fiber cloths were then placed in an oven and heated and dried at 175° C. for 2 to 15 minutes to produce prepregs in a semi-cured state (B-stage) (the resin content of the prepreg was 70%). Four pieces of the prepregs were then superimposed, and two sheets of copper foils (each 0.5 oz.) were respectively superimposed on both of the two external surfaces of the superimposed prepregs. A hot-pressing operation was then performed on each of the prepared objects. The hot-pressing conditions were as follows: heating to 200° C. at a heating rate of 3.0° C./min, and hot-pressing at 200° C. for 120 minutes under a full pressure of 15 kg/cm' (the initial pressure was 8 kg/cm²).

The properties of the prepregs and metal-clad laminates of Examples 1 to 6 and Comparative Examples 1 to 8, including the dynamic viscosity, Tg, solder resistance, Dk and Df, were measured according to the aforementioned testing methods, and the results are listed in Tables 3-1, 3-2, 4-1, and 4-2.

TABLE 3-1

Dynamic viscosity of prepregs of the Examples

| Unit: Pa · s | Example | | | | | |
|---|---|---|---|---|---|---|
| | 1 | 2 | 3 | 4 | 5 | 6 |
| Just prepared | 339 | 351 | 341 | 360 | 354 | 351 |
| Stored for 1 week | 339 | 351 | 341 | 363 | 354 | 355 |
| Stored for 2 weeks | 342 | 352 | 343 | 368 | 355 | 358 |
| Stored for 3 weeks | 342 | 352 | 342 | 372 | 355 | 361 |
| Stored for 4 weeks | 344 | 356 | 345 | 377 | 359 | 366 |
| Stored for 5 weeks | 339 | 360 | 341 | 380 | 363 | 371 |
| Stored for 6 weeks | 338 | 364 | 342 | 387 | 367 | 375 |
| Stored for 7 weeks | 348 | 366 | 350 | 395 | 369 | 383 |
| Stored for 8 weeks | 341 | 369 | 348 | 399 | 372 | 389 |
| Stored for 9 weeks | 340 | 374 | 346 | 410 | 377 | 395 |
| Stored for 10 weeks | 340 | 377 | 350 | 417 | 380 | 400 |
| Stored for 11 weeks | 342 | 382 | 351 | 421 | 385 | 409 |

TABLE 3-2

Properties of prepregs and metal-clad laminates of the Examples

| Unit | | Tg ° C. | Solder resistance times | Dk @ 10 GHz | Df @ 10 GHz |
|---|---|---|---|---|---|
| Example | 1 | 220 | >20 | 3.5 | 0.0045 |
| | 2 | 221 | >20 | 3.5 | 0.0045 |
| | 3 | 220 | >20 | 3.5 | 0.0045 |
| | 4 | 220 | >20 | 3.5 | 0.0045 |
| | 5 | 220 | >20 | 3.5 | 0.0045 |
| | 6 | 220 | >20 | 3.5 | 0.0045 |

TABLE 4-1

Dynamic viscosity of prepregs of the Comparative Examples

| Unit: Pa · s | Comparative Example | | | | | | | |
|---|---|---|---|---|---|---|---|---|
| | 1 | 2 | 3 | 4 | 5 | 6 | 7 | 8 |
| Just prepared | 350 | 345 | 349 | 330 | 336 | 340 | 345 | 319 |
| Stored for 1 week | 348 | 347 | 355 | 347 | 336 | 346 | 345 | 317 |
| Stored for 2 weeks | 351 | 345 | 361 | 350 | 336 | 349 | 348 | 317 |
| Stored for 3 weeks | 352 | 349 | 368 | 355 | 337 | 351 | 348 | 318 |
| Stored for 4 weeks | 356 | 362 | 374 | 362 | 336 | 367 | 350 | 320 |
| Stored for 5 weeks | 349 | 383 | 381 | 383 | 337 | 385 | 345 | 321 |
| Stored for 6 weeks | 355 | 389 | 389 | 389 | 338 | 391 | 344 | 321 |
| Stored for 7 weeks | 359 | 402 | 400 | 412 | 338 | 410 | 354 | 321 |
| Stored for 8 weeks | 349 | 422 | 417 | 441 | 343 | 426 | 347 | 322 |
| Stored for 9 weeks | 348 | 435 | 423 | 460 | 340 | 440 | 346 | 321 |
| Stored for 10 weeks | 353 | 471 | 433 | 491 | 339 | 480 | 346 | 323 |
| Stored for 11 weeks | 359 | 497 | 467 | 560 | 340 | 502 | 350 | 323 |

TABLE 4-2

Properties of prepregs and metal-clad laminates of the Comparative Examples

| Unit | | Tg ° C. | Solder resistance times | Dk @ 10 GHz | Df @ 10 GHz |
|---|---|---|---|---|---|
| Comparative Example | 1 | 217 | >20 | 3.5 | 0.0045 |
| | 2 | 221 | >20 | 3.5 | 0.0045 |
| | 3 | 220 | >20 | 3.5 | 0.0045 |
| | 4 | 221 | >20 | 3.5 | 0.0045 |
| | 5 | 206 | >20 | 3.5 | 0.0045 |
| | 6 | 220 | >20 | 3.5 | 0.0045 |
| | 7 | 218 | >20 | 3.5 | 0.0045 |
| | 8 | 216 | >20 | 3.5 | 0.0045 |

As shown in Tables 3-1 and 3-2, each of the electronic materials prepared from the resin composition of the present invention exhibits satisfactory physicochemical properties and dielectric properties (e.g., Dk, Df, solder resistance, and so on). The prepregs prepared by using the resin composition of the present invention can simultaneously be provided with good storage stability (i.e., a lower rate of change of dynamic viscosity over a long period of time) and a shortened required pressing time (The Tg of all of the metal-clad laminates reached 220° C. after a 120-minute pressing, which showed that all of the metal-clad laminates were in a fully-cured state, i.e., C-stage). In addition, as shown by comparing Examples 1, 2, 3 and 5 with Examples 4 and 6, when the $T_{1,1/2}$ is 20° C. to 35° C. higher than $T_{2,1/2}$, the prepregs prepared thereby can have a further lowered rate of change of dynamic viscosity over a long period of time, that is, a further improved storage stability.

By contrast, as shown in Tables 4-1 and 4-2, the electronic materials prepared by using resin compositions other than the resin composition of the present invention are incapable of simultaneously being provided with good storage stability and a shortened required pressing time. That is, no appropriate balance between the storage stability and the required pressing time can be achieved, such that the efficacy of the present invention cannot be provided. Specifically, as shown in Comparative Examples 1 and 2, when the resin composition only comprises one initiator, the prepregs prepared thereby are incapable of simultaneously being provided with good storage stability and a shortened required pressing time. As shown in Comparative Examples 3, 4, 7 and 8, in the case that the resin composition comprises two different initiators, if the difference between $T_{1,1/2}$ and $T_{2,1/2}$ falls outside the designated range of the present invention, the prepregs prepared thereby are incapable of simultaneously having good storage stability and a shortened required pressing time even when $T_{1,1/2}$ falls inside the designated range. In addition, as shown in Comparative Examples 5 and 6, in the case that the resin composition comprises two different initiators, if $T_{1,1/2}$ falls outside the designated range of the present invention, the prepregs prepared thereby are incapable of simultaneously being provided with good storage stability and a shortened required pressing time even when the difference between $T_{1,1/2}$ and $T_{2,1/2}$ falls inside the designated range. The above experimental results show that the resin composition of the present invention indeed provides unexpected effects by means of using specific constituents in combination, including initiators with specific half-life temperature requirements.

The above examples are used to illustrate the principle and efficacy of the present invention and show the inventive features thereof, but are not used to limit the scope of the present invention. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, which comprises:
   (A) a polyphenylene ether resin with unsaturated end groups;
   (B) a constituent with a maleimide structure;
   (C) a first initiator, which has a first one-minute half-life temperature $T_{1,1/2}$; and
   (D) a second initiator, which has a second one-minute half-life temperature $T_{2,1/2}$,
   wherein $T_{1,1/2}$ is 170° C. to 220° C. and $T_{1,1/2}$ is 20° C. to 50° C. higher than $T_{2,1/2}$,
   wherein the polyphenylene ether resin (A) with unsaturated end groups is different from the constituent (B) with a maleimide structure.

2. The resin composition of claim 1, wherein $T_{1,1/2}$ is 21° C. to 35° C. higher than $T_{2,1/2}$.

3. The resin composition of claim 2, further comprising a cross-linking agent selected from the group consisting of polyfunctional allylic compounds, polyfunctional acrylates, polyfunctional acrylamides, polyfunctional styrenic compounds, and combinations thereof.

4. The resin composition of claim 2, further comprising a flame retardant selected from the group consisting of phosphorus-containing flame retardants, bromine-containing flame retardants, nitrogen-containing compounds, and combinations thereof.

5. The resin composition of claim 2, further comprising a filler selected from the group consisting of silica, magnesium oxide, magnesium hydroxide, calcium carbonate, talc, clay, aluminum nitride, aluminum oxide, aluminum hydroxide, boron nitride, silicon nitride, silicon aluminum carbide, silicon carbide, sodium carbonate, magnesium carbonate, titanium dioxide, zinc oxide, zirconium oxide, quartz, diamond powders, diamond-like powders, graphite, calcined kaolin, pryan, mica, hydrotalcite, polytetrafluoroethylene (PTFE) powders, glass beads, ceramic whiskers, carbon nanotubes, nanosized inorganic powders, and combinations thereof.

6. The resin composition of claim 1, wherein the weight ratio of the first initiator (C) to the second initiator (D) is 6:1 to 1:6.

7. The resin composition of claim 6, further comprising a cross-linking agent selected from the group consisting of polyfunctional allylic compounds, polyfunctional acrylates, polyfunctional acrylamides, polyfunctional styrenic compounds, and combinations thereof.

8. The resin composition of claim 6, further comprising a flame retardant selected from the group consisting of phosphorus-containing flame retardants, bromine-containing flame retardants, nitrogen-containing compounds, and combinations thereof.

9. The resin composition of claim 6, further comprising a filler selected from the group consisting of silica, magnesium oxide, magnesium hydroxide, calcium carbonate, talc, clay, aluminum nitride, aluminum oxide, aluminum hydroxide, boron nitride, silicon nitride, silicon aluminum carbide, silicon carbide, sodium carbonate, magnesium carbonate, titanium dioxide, zinc oxide, zirconium oxide, quartz, diamond powders, diamond-like powders, graphite, calcined kaolin, pryan, mica, hydrotalcite, polytetrafluoroethylene (PTFE) powders, glass beads, ceramic whiskers, carbon nanotubes, nanosized inorganic powders, and combinations thereof.

10. The resin composition of claim 1, wherein the polyphenylene ether resin (A) with unsaturated end groups is represented by the following formula (I):

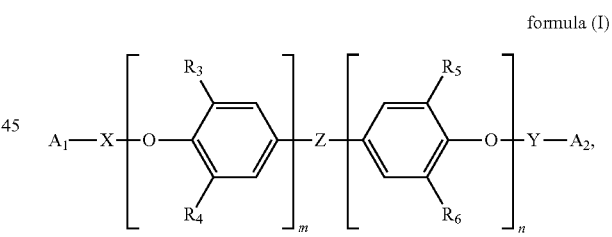

formula (I)

in formula (I),
$R_3$, $R_4$, $R_5$, and $R_6$ are independently H or a substituted or unsubstituted C1-C5 alkyl;
m and n are independently an integer ranging from 0 to 100, with the proviso that m and n are not 0 at the same time;
Z is absent, —O—,

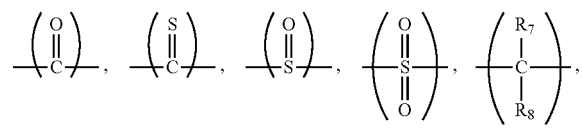

or an aryl, wherein $R^7$ and $R_8$ are independently H or a C1-C12 alkyl;

X and Y are independently absent, a carbonyl group, or an alkenyl-containing group; and $A_1$ and $A_2$ are independently

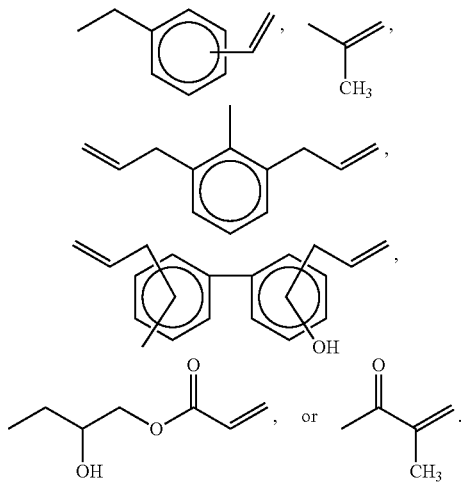

11. The resin composition of claim 1, wherein the constituent (B) with a maleimide structure is selected from the group consisting of 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenylether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, 3,3'-dimethyl-5,5'-diethyl-4,4'-diphenylmethylbismaleimide, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide, N,N'-methylene bis (3-chloro-p-phenylene)bismaleimide, and combinations thereof.

12. The resin composition of claim 1, wherein the first initiator (C) is selected from the group consisting of n-butyl 4,4-bis(tert-butylperoxy)valerate, tert-butylcumyl peroxide, dicumyl peroxide, 1,3-di-(2-tert-butyl-peroxyisopropyl)benzene, 2,5-dimethyl-2,5-di-(tert-butylperoxy)hexane, di-tert-butyl peroxide, 2,5-dimethyl-2,5-di(tert-butylperoxy)-3-hexyne, diisopropylbenzene hydroperoxide, p-menthane hydroperoxide, and combinations thereof.

13. The resin composition of claim 1, wherein the second initiator (D) is selected from the group consisting of 1,1,3,3-tetramethylbutylperoxy-2-ethylhexanoate, tert-amylperoxy-2-ethylhexanoate, dibenzoyl peroxide, tert-hexylperoxy-2-ethylhexanoate, tert-butylperoxy-2-ethylhexanoate, tert-butylperoxyisobutyrate, 1,1-di(tert-butylperoxy)-3,3,5-trimethylcyclohexane, 1,1-di(tert-hexylperoxy)cyclohexane, tert-amylperoxy-2-ethyl hexylcarbonate, 1,1-di(tert-butylperoxy)cyclohexane, tert-butylperoxyisopropylcarbonate, 2,2-di(tert-butylperoxy)butane, tert-butylperoxyacetate, tert-butylperoxy-2-ethylhexylcarbonate, tert-butylperoxy-3,3,5-trimethylhexanoate, tert-butylperoxybenzoate, di-tert-amyl peroxide, tert-butylcumyl peroxide, dicumyl peroxide, 1,3-di-(2-tert-butyl-peroxyisopropyl)benzene, 2,5-dimethyl-2,5-di-(tert-butylperoxy)hexane, di-tert-butyl peroxide, 2,5-dimethyl-2,5-di(tert-butylperoxy)-3-hexyne, and combinations thereof.

14. The resin composition of claim 1, further comprising a cross-linking agent selected from the group consisting of polyfunctional allylic compounds, polyfunctional acrylates, polyfunctional acrylamides, polyfunctional styrenic compounds, and combinations thereof.

15. The resin composition of claim 1, further comprising a flame retardant selected from the group consisting of phosphorus-containing flame retardants, bromine-containing flame retardants, nitrogen-containing compounds, and combinations thereof.

16. The resin composition of claim 1, further comprising a filler selected from the group consisting of silica, magnesium oxide, magnesium hydroxide, calcium carbonate, talc, clay, aluminum nitride, aluminum oxide, aluminum hydroxide, boron nitride, silicon nitride, silicon aluminum carbide, silicon carbide, sodium carbonate, magnesium carbonate, titanium dioxide, zinc oxide, zirconium oxide, quartz, diamond powders, diamond-like powders, graphite, calcined kaolin, pryan, mica, hydrotalcite, polytetrafluoroethylene (PTFE) powders, glass beads, ceramic whiskers, carbon nanotubes, nanosized inorganic powders, and combinations thereof.

17. A prepreg, which is prepared by impregnating a substrate with the resin composition of claim 1 or by coating the resin composition of claim 1 onto a substrate and drying the impregnated or coated substrate.

18. A metal-clad laminate, which is prepared by laminating the prepreg of claim 17 and a metal foil.

19. A printed circuit board, which is prepared from the metal-clad laminate of claim 18.

* * * * *